(12) United States Patent
Takeda

(10) Patent No.: US 8,604,357 B2
(45) Date of Patent: Dec. 10, 2013

(54) WIRING BOARD HAVING VIA AND METHOD FORMING A VIA IN A WIRING BOARD

(75) Inventor: Tsutomu Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 532 days.

(21) Appl. No.: 12/501,044

(22) Filed: Jul. 10, 2009

(65) Prior Publication Data

US 2010/0012366 A1 Jan. 21, 2010

(30) Foreign Application Priority Data

Jul. 15, 2008 (JP) ................................. 2008-183665

(51) Int. Cl.
*H05K 3/42* (2006.01)
*H05K 3/30* (2006.01)
*H05K 1/11* (2006.01)

(52) U.S. Cl.
USPC ................ 174/261; 29/835; 29/837; 174/266

(58) Field of Classification Search
USPC ......................................................... 174/261
See application file for complete search history.

(56) References Cited

U.S. PATENT DOCUMENTS

| | | | | |
|---|---|---|---|---|
| 6,137,064 A * | 10/2000 | Kiani et al. | .................... | 174/266 |
| 6,388,208 B1 * | 5/2002 | Kiani et al. | .................... | 174/266 |
| 6,514,090 B1 * | 2/2003 | Neal et al. | ........................ | 439/75 |
| 6,593,535 B2 * | 7/2003 | Gailus | ........................... | 174/262 |
| 6,711,814 B2 * | 3/2004 | Barr et al. | ....................... | 29/852 |
| 6,891,272 B1 * | 5/2005 | Fjelstad et al. | ................ | 257/774 |
| 6,995,322 B2 * | 2/2006 | Chan et al. | .................... | 174/262 |
| 7,096,555 B2 * | 8/2006 | Tourne et al. | ............. | 29/402.06 |
| 7,297,877 B2 * | 11/2007 | Chiu | .............................. | 174/262 |
| 8,158,892 B2 * | 4/2012 | Goergen et al. | ............... | 174/266 |
| 2002/0179332 A1 * | 12/2002 | Uematsu et al. | .............. | 174/262 |
| 2004/0251047 A1 * | 12/2004 | Bartley et al. | ................ | 174/262 |
| 2006/0090933 A1 | 5/2006 | Wig et al. | | |
| 2006/0154496 A1 * | 7/2006 | Imamura et al. | ................ | 439/66 |
| 2007/0033457 A1 * | 2/2007 | Park et al. | ..................... | 714/724 |

(Continued)

FOREIGN PATENT DOCUMENTS

| | | |
|---|---|---|
| JP | 1998051137 A | 2/1998 |
| JP | 1999233925 A | 8/1998 |

(Continued)

OTHER PUBLICATIONS

Japanese Office Action for JP2008-183665 mailed on Sep. 11, 2012.

(Continued)

*Primary Examiner* — Timothy Thompson
*Assistant Examiner* — Nathan Milakovich (57) ABSTRACT

A wiring board has a plurality of wiring layers, a first land, a second land, a first via and a second via. The first land and the second land are formed on at least one wiring layer of the wiring board and are disposed to partially overlap with each other. The first via and the second via are formed in association with the first land and the second land, respectively. The first via and the second via electrically connect a first wiring layer and a second wiring layer of the plurality of wiring layers to each other. The wiring board has a separator that is formed by a hole that separates the first land and the second land from each other.

6 Claims, 7 Drawing Sheets

(56) References Cited

U.S. PATENT DOCUMENTS

| | | | |
|---|---|---|---|
| 2007/0298601 A1* | 12/2007 | Booth et al. | 438/597 |
| 2008/0060837 A1* | 3/2008 | Matsui | 174/261 |
| 2008/0218985 A1* | 9/2008 | Takeda | 361/768 |
| 2011/0226516 A1* | 9/2011 | Takeda | 174/260 |

FOREIGN PATENT DOCUMENTS

| | | | |
|---|---|---|---|
| JP | 2001053397 A | 2/2001 | |
| JP | 2001168489 A | 6/2001 | |
| JP | 2002353588 A | 12/2002 | |
| JP | 2003178827 A | 6/2003 | |
| JP | 2003218480 A | 7/2003 | |
| JP | 2004342871 A | 12/2004 | |
| JP | 2005-322807 A | 11/2005 | |
| JP | 2006108445 A | 4/2006 | |
| JP | 2008518486 A | 5/2008 | |

OTHER PUBLICATIONS

Japanese Office Action for JP 2008-183665 mailed on Jun. 18, 2013 with Partial English Translation.

* cited by examiner

WIRING BOARD HAVING VIA AND METHOD FORMING A VIA IN A WIRING BOARD

This application is based upon and claims the benefit of priority from Japanese patent application No. 2008-183665, filed on Jul. 15, 2008, the disclosure of which is incorporated herein in its entirety by reference.

BACKGROUND OF THE INVENTION

1. Field of the Invention

The present invention relates to a wiring board having a plurality of wiring layers, method forming a via in the wiring board, and a method of manufacturing the wiring board.

2. Description of the Related Art

As miniaturization of wiring patterns formed on wiring boards advances, and the rate of signal transmission increases, the influence of noise signals occurring between adjacent lines increases. To reduce such noise, a wiring board having a pair of signal lines (referred to as differential lines, hereinafter) for transmitting differential signals has been in practical use.

A wiring board having a plurality of wiring layers has a via formed for electrically connecting the wiring layers to each other. In the case where differential signals are transmitted, a pair of vias for differential lines is preferably formed (see Japanese Patent Laid-Open Nos. 2001-053397 and 2002-353588).

In the case where a high frequency signal at about 1 GHz or higher is transmitted, a via for a grounding line is preferably formed in the vicinity of the vias for the differential lines. The wiring board described in Japanese Patent Laid-Open Nos. 2001-053397 and 2002-353588 has a pair of vias for differential lines formed to penetrate through a region surrounded by a via used for a grounding line. With such a configuration, the wiring board is less likely to be affected by external noise.

When a pair of vias is formed close to each other in a wiring board, the vias are disposed so that the space between the lands for the vias is equal to or larger than a certain distance to prevent electrical short-circuits between the lands. In particular, the outermost wiring layer exposed on the surface of the wiring board is thicker than the other wiring layers because of the plating that is used to form the vias. Therefore, for the outermost layer of the wiring board, the space between the lands needs to be large in order to prevent dielectric breakdown. For example, the space between the lands needs to be equal to 120 μm-140 μm or larger.

Therefore, in the wiring boards described in Japanese Patent Laid-Open Nos. 2001-053397 and 2002-353588, there is a limit to reduction of the space between the vias.

When the space between the vias is large, there is a problem in which the electromagnetic coupling intensity of the differential signals transmitted through the differential lines will decrease, and in which it will be difficult to ensure signal integrity. In addition, when the space between the vias is large, there is a problem that the region in which the wiring pattern is to be formed (referred to simply as a wiring region, hereinafter) increases.

SUMMARY

The present invention seeks to solve one or more of the above problems, or to improve upon those problems at least in part. An example of the object is to reduce the space between vias formed in a wiring board.

A wiring board according to an exemplary aspect of the invention has a plurality of wiring layers, a first land, a second land, a first via and a second via. The first land and the second land are formed on at least one wiring layer of the wiring board and are disposed to partially overlap with each other. The first via and the second via are formed in association with the first land and the second land, respectively, and electrically connect a first wiring layer and a second wiring layer of the plurality of wiring layers to each other. The wiring board further has a separator formed by a hole that separates the first land and the second land from each other.

A via forming method according to an exemplary aspect of the invention is a method of forming, in a wiring board having a plurality of wiring layers, a first via and a second via that electrically connect a first wiring layer and a second wiring layer of the plurality of wiring layers to each other and that includes a first step and a second step. In the first step, a first land and a second land are disposed on one surface of the wiring board in such a manner that the first land and the second land partially overlap with each other, and the first via and the second via are formed in association with the first land and the second land, respectively. In the second step, a separator formed by a hole that separates the first land and the second land from each other is formed.

A method of manufacturing a wiring board according to an exemplary aspect of the invention is a method of manufacturing a wiring board that has a plurality of wiring layers and a first via and a second via that electrically connect a first wiring layer and a second wiring layer of the plurality of wiring layers to each other. The method of manufacturing a wiring board is characterized in that the first via and the second via are formed by the via forming method described above.

According to these inventions, the space between vias formed in a wiring board can be reduced.

The above and other objects, features and advantages of the present invention will become apparent from the following description with reference to the accompanying drawings which illustrate examples of the present invention.

DETAILED DESCRIPTION OF THE EXAMPLY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. A wiring board according to the present invention is suitably used as a double-sided wiring board or as a multilayer wiring board having a pair of vias for differential lines, for example.

First Exemplary Embodiment

Figure 1A:
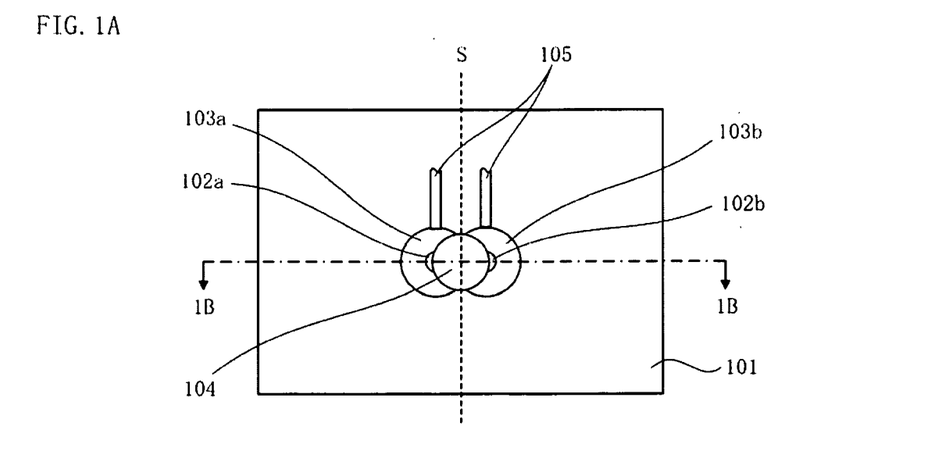
FIG. 1A is a schematic plan view of a wiring board according to a first exemplary embodiment.
Figure 1B:
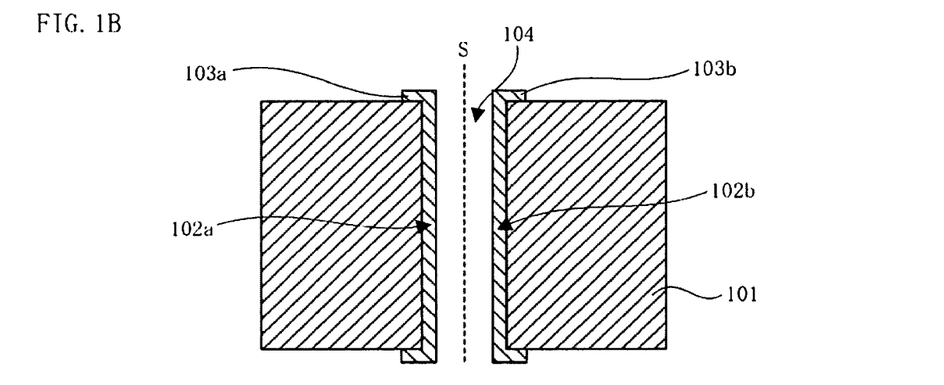
FIG. 1B is a schematic cross-sectional view of the wiring board taken along the line 1B-1B in FIG. 1A.
Figure 1C:
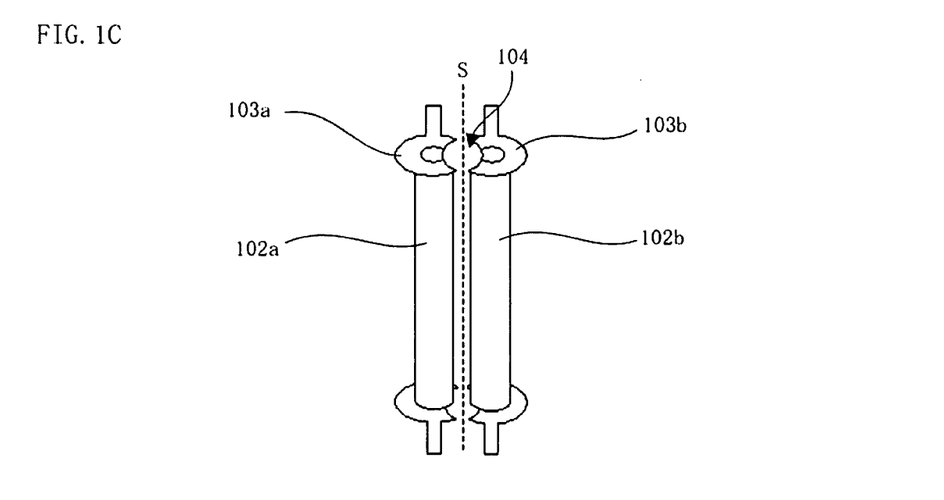
FIG. 1C is a schematic perspective view of lands formed on and vias formed in the wiring board shown in FIG. 1A.

FIG. 1A is a schematic plan view of a wiring board according to a first exemplary embodiment, and FIG. 1B is a schematic cross-sectional view of the wiring board taken along the line 1B-1B in FIG. 1A. FIG. 1C is a schematic perspective view of lands formed on and vias formed in the wiring board. However, for the sake of clarity, the wiring board is not shown in FIG. 1C.

Wiring board 101 according to this exemplary embodiment has two wiring layers on which wiring pattern 105 is formed. In addition, first via 102a and second via 102b that electrically connect one of the two wiring layers to another are formed in wiring board 101. First via 102a and second via 102b each comprise a hole that interconnects the wiring layers and a conductor that is formed on the inner surface of the hole. The hole can be partially or completely filled with the conductor.

On at least one surface of wiring board 101, first land 103a and second land 103b are formed. First land 103a and second land 103b are disposed so as to partially overlap with each other.

First via 102a and second via 102b are formed in association with first land 103a and second land 103b, respectively. First land 103a electrically connects first via 102a and wiring pattern 105 to each other. Second land 103b electrically connects second via 102b and wiring pattern 105 to each other.

First land 103a and second land 103b are separated from each other by separator 104, which consists of a hole formed in wiring board 101. As a result, first via 102a and second via 102b are insulated from each other. In the first exemplary embodiment, separator 104 is a through-hole that penetrates through wiring board 101. The through-hole is formed substantially in parallel with the holes of first via 102a and second via 102b.

Since first via 102a and second via 102b are formed so that first land 103a and second land 103b partially overlap with each other, and then separator 104 is formed in wiring board 101 to separate first land 103a and second land 103b from each other, wiring board 101 that has such a configuration can be easily manufactured.

According to this configuration, the space between first via 102a and second via 102b can be reduced. This is because as the overlapping area of first land 103a and second land 103b increases in the step of forming the vias, first via 102a and second via 102b are brought closer to each other. Thus, the wiring region of wiring board 101 can be reduced.

Separator 104 that separates first land 103a and second land 103b from each other insulates first via 102a and second via 102b from each other. The hole of separator 104 can have any shape that can separate first via 102a and second via 102b from each other.

By appropriately determining the shape and size of the hole of separator 104, the distance between the lands can be set at a predetermined value.

If first via 102a is connected to a positive line, and second via 102b is connected to a negative line, first via 102a and second via 102b can be made to function as a pair of vias for differential lines. In that case, the space between the paired vias for differential signals can be reduced, the electromagnetic coupling intensity of the signals increases, and thus, the signal integrity can be ensured.

The hole of separator 104 can be separate from the hole of first via 102a and the hole of second via 102b.

Alternatively, the hole of separator 104 can be coupled to the hole of first via 102a and the hole of second via 102b. In this case, in a plane parallel with the wiring layer, the hole of separator 104 partially overlaps with the hole of first via 102a and the hole of second via 102b (see FIG. 1A). In this case, when separator 104 is formed, part of the conductor of first via 102a and second via 102b is removed. As a result, the conductor of first via 102a and the conductor of second via 102b are opposite to each other with separator 104 interposed therebetween. As a result, the coupling intensity of the signals transmitted through the pair of vias for the differential lines further increases, and the wiring board can be made more resistant to noise.

The shape of the cross section of the hole of separator 104 parallel with the wiring layer (referred to simply as a cross-sectional shape, hereinafter) can be any shape. In this exemplary embodiment, the cross-sectional shape of the hole of separator 104 is a circular shape.

In this specification, a simple phrase "cross-sectional shape" refers to the shape of the cross section parallel with the wiring layer.

In addition, the shape of the hole of separator 104 is preferably symmetrical with respect to a plane S that is perpendicular to the wiring layer and that is at an equal distance from the first and second vias. Such a shape of separator 104 helps to increase the electromagnetic coupling intensity of the differential signals and thus make the wiring board more resistant to noise.

In this exemplary embodiment, the hole of separator 104 penetrates through wiring board 101. However, separator 104 does not need to penetrate through wiring board 101 provided that first land 103a and second land 103b are insulated from each other. In that case, the holes of separators are formed in each surface of wiring board.

When first via 102a and second via 102b are used as vias for differential lines, a grounding via (not shown in figure) connected to a grounding line is preferably formed in the vicinity of first via 102a and second via 102b.

Next, a method for forming the via according to this exemplary embodiment will be described. FIGS. 2A, 3A, 4A and 5A are schematic plan views of a surface of the wiring board on which a wiring layer is formed that illustrate different steps in the via forming method according to this exemplary embodiment. FIGS. 2B, 3B, 4B and 5B are schematic cross-sectional views of the wiring board taken along the respective section lines (alternate long and short dash lines) shown in FIGS. 2A, 3A, 4A and 5A.

A method of manufacturing the wiring board includes a first step and a second step. In the first step, positions of first land 103a and second land 103b on one surface of the wiring board are determined so that first land 103a and second land 103b partially overlap with each other. Then, first via 102a that electrically connects each of two wiring layers to each other is formed in association with first land 103a. Furthermore, second via 102b that electrically connects the one wiring layer and the other wiring layer to each other is formed in association with second land 103b.

Figure 2A:
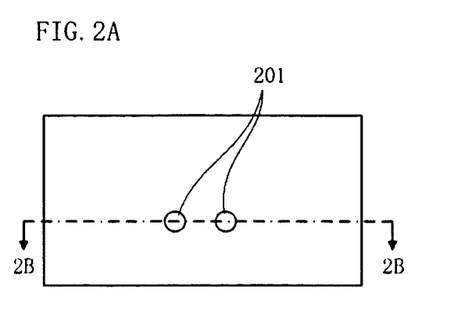
FIG. 2A is a schematic plan view of the wiring board at the time when one step in the method forming a via is completed.
Figure 2B:
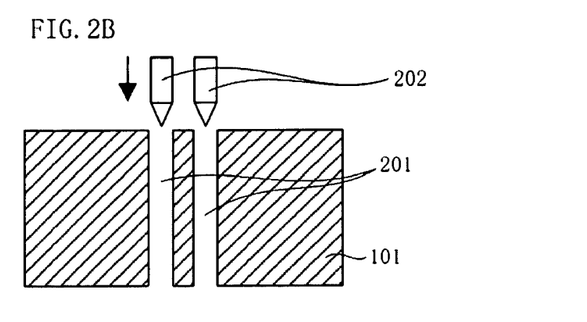
FIG. 2B is a schematic cross-sectional view of the wiring board taken along the line 2B-2B in FIG. 2A.
Figure 3A:
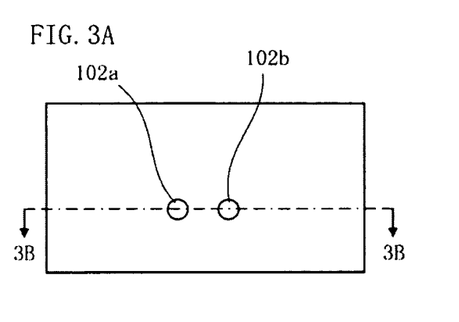
FIG. 3A is a schematic plan view of the wiring board at the time when one step in the method forming a via is completed.
Figure 3B:
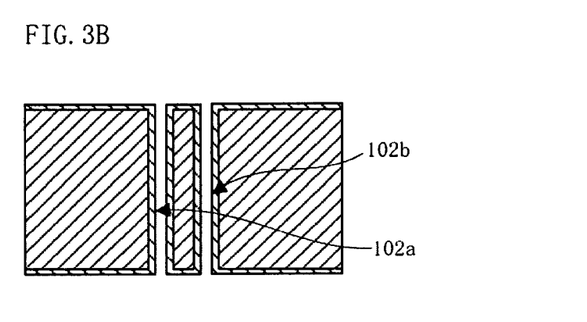
FIG. 3B is a schematic cross-sectional view of the wiring board taken along the line 3B-3B in FIG. 3A.

Specifically, two through-holes 201 are formed in wiring board 101 with drill 202 (see FIGS. 2A and 2B), and a conductor is deposited in each through-hole 201 (see FIGS. 3A and 3B). In this way, first via 102a and second via 102b are formed.

The conductor can be deposited by plating. The method of forming through-hole 201 is not limited to the method that uses drill 202, and various methods can be used for forming through-hole 201.

Figure 4A:
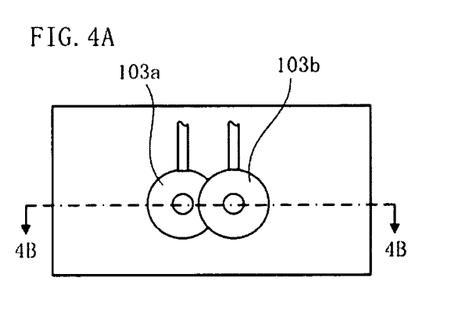
FIG. 4A is a schematic plan view of the wiring board at the time when one step in the method forming a via is completed.
Figure 4B:
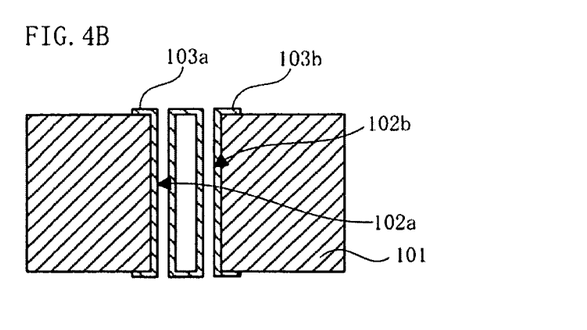
FIG. 4B is a schematic cross-sectional view of the wiring board taken along the line 4B-4B in FIG. 4A.

Then, part of the plating formed on at least one surface of wiring board 101 is removed by etching, for example, thereby forming first land 103a and second land 103b (see FIGS. 4A and 4B). In this process, wiring pattern 105 is preferably formed on the surface of wiring board 101 at the same time. First land 103a and second land 103b are formed to partially overlap with each other.

Typically, to prevent dielectric breakdown of separate vias, the vias are positioned so that the lands are sufficiently spaced apart from each other. However, in this exemplary embodiment, since the first and second lands are disposed to overlap with each other, the space between the first and second vias can be reduced.

Note that either lands 103a and 103b or vias 102a and 102b can be formed first. Alternatively, lands 103a, 103b and vias 102a, 102b can be formed simultaneously.

Figure 5A:
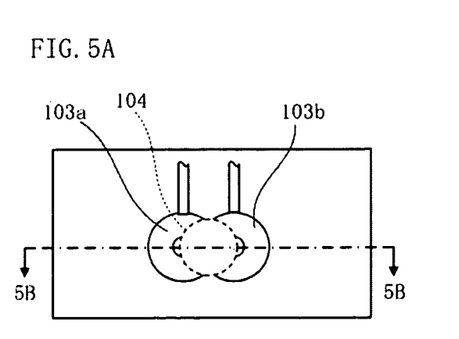
FIG. 5A is a schematic plan view of the wiring board at the time when one step in the method forming a via is completed.
Figure 5B:
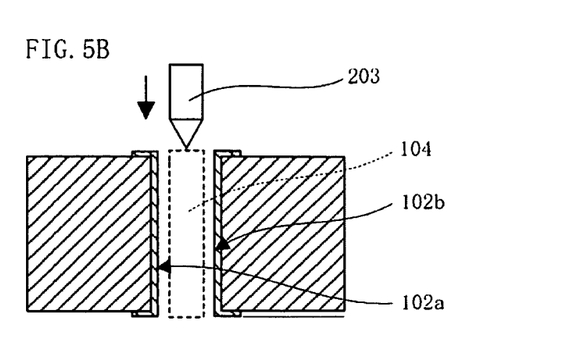
FIG. 5B is a schematic cross-sectional view of the wiring board taken along the line 5B-5B in FIG. 5A.

In the second step, separator 104 is formed in wiring board 101 to partially overlap with first land 103a and second land 103b to separate first land 103a and second land 103b from each other (see FIGS. 5A and 5B). Separator 104 can have any cross-sectional shape that can insulate first land 103a and second land 103b from each other.

In addition, separator 104 can be a hole that has sufficient size to reach the hole of first via 102a and the hole of second via 102b. In that case, part of the conductor of first via 102a and second via 102b is removed. As a result, the conductor of first via 102a and the conductor of second via 102b are opposite to each other with the hole of separator 104 interposed therebetween. Therefore, in the case where first via 102a and second via 102b are used as a pair of vias for differential lines, the coupling intensity of the differential signals can be increased.

In this exemplary embodiment, separator 104 that has circular cross-sectional shape is formed with drill 203. Specifically, separator 104 is formed by positioning drill 203 at the region where first land 103a and second land 103b overlap with each other. In this way, separator 104 can be easily formed, and first via 102a and second via 102b can be easily insulated from each other.

In this exemplary embodiment, first land 103a and second land 103b have a circular shape before separator 104 is formed. Therefore, once separator 104 is formed, first land 103a and second land 103b have a substantially crescent shape, and the pointed ends of the crescent-shaped lands are opposite to each other.

If first via 102a and second via 102b are allocated to a positive line and a negative line for differential signals, respectively, a wiring board adapted for differential signals can be provided.

The wiring board according to this exemplary embodiment can be easily manufactured by carrying out the via forming method described above. The wiring pattern can be formed based on any known technique.

Second Exemplary Embodiment

Figure 6A:
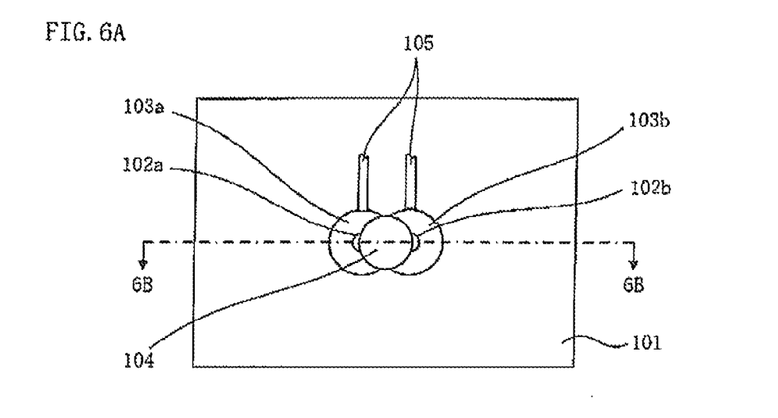
FIG. 6A is a schematic plan view of a wiring board according to a second exemplary embodiment.
Figure 6B:
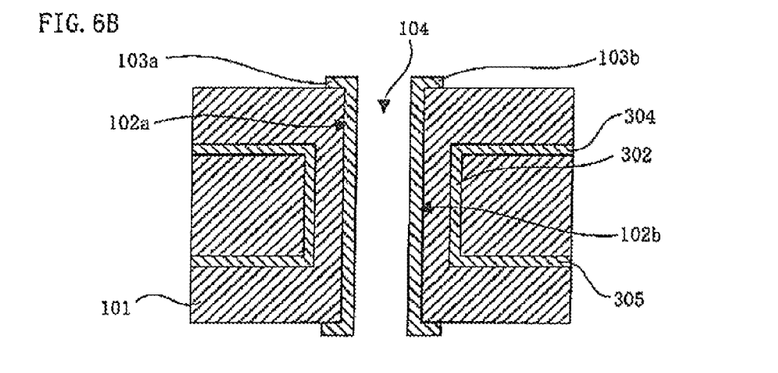
FIG. 6B is a schematic cross-sectional view of the wiring board taken along the line 6B-6B in FIG. 6A.
Figure 6C:
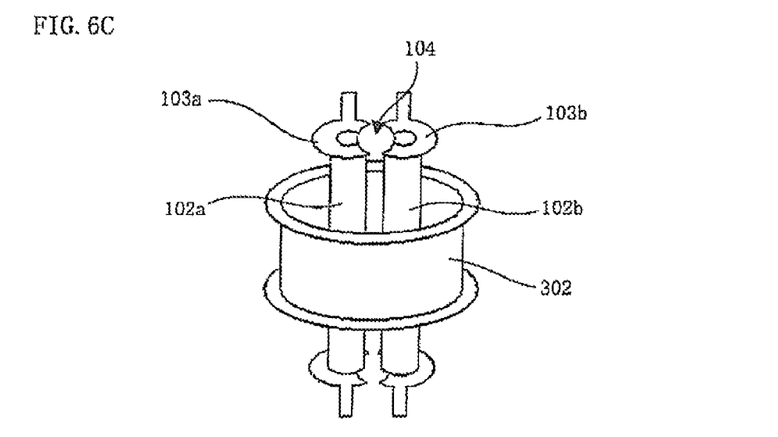
FIG. 6C is a schematic perspective view of lands formed on and vias formed in the wiring board shown in FIG. 6A.

FIG. 6A is a schematic plan view of a wiring board according to a second exemplary embodiment, FIG. 6B is a schematic cross-sectional view of the wiring board taken along the line 6B-6B in FIG. 6A. FIG. 6C is a schematic perspective view of vias formed in and lands formed on the wiring board. However, for the sake of clarity, wiring board 101 is not shown in FIG. 6C.

Wiring board 101 according to the second exemplary embodiment has four wiring layers. Of the two inner wiring layers that are not exposed on the surfaces of wiring board 101, one wiring layer is grounding (GND) layer 305, and the other wiring layer is power supply layer 304. The two layers exposed on the surfaces of wiring board 101 are signal layers on which wiring pattern 105 for transmitting a signal is formed.

In this exemplary embodiment, grounding via 302 that electrically connects grounding layer 305 and power supply layer 304 to each other is formed. An insulator is deposited in grounding via 302. The insulator is preferably the same as the material of an insulating layer of the wiring board.

In addition, wiring board 101 has first via 102a and second via 102b that penetrate through wiring board 101. First via 102a and second via 102b have the same structure as that described in the first exemplary embodiment.

In this exemplary embodiment, first via 102a and second via 102b are formed to penetrate through an inner region of grounding via 302 (see FIG. 6C). That is, viewed in a cross section that is parallel with the wiring layers, first via 102a and second via 102b are surrounded by grounding via 302.

As in the first exemplary embodiment, if first via 102a and second via 102b are allocated to a positive line and a negative line for differential signals, respectively, a wiring board adapted for differential signals can be provided.

For the wiring board configured in this way, since grounding via 302 can be disposed close to the pair of vias for differential signals, the increase in impedance can be suppressed. Thus, the wiring board is capable of high frequency transmission.

Figure 7:
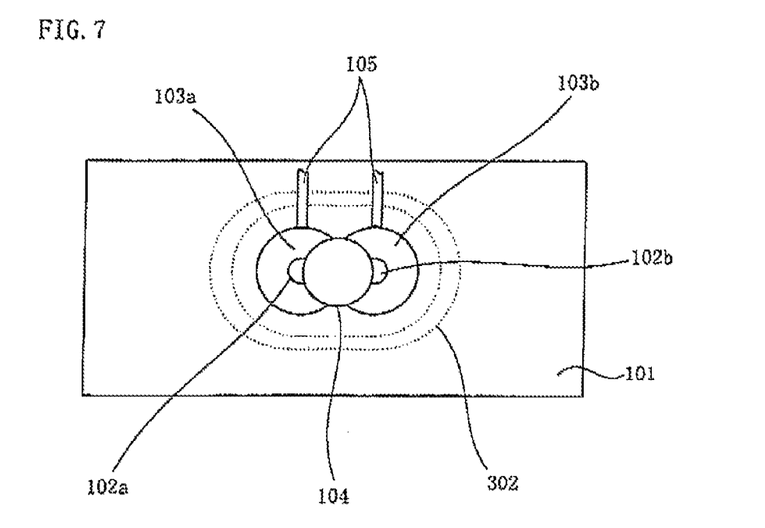
FIG. 7 is a schematic cross-sectional view showing a modification example of the shape of a via for a grounding line of the wiring board according to the second exemplary embodiment.

The cross-sectional shape of grounding via 302 (the shape of the cross section parallel with the wiring layers) is not limited to a particular one but preferably is an elliptical shape (see FIG. 7). In FIG. 7, for the sake of clarity, grounding via 302 formed in the inner wiring layers of wiring board 101 is shown by the dotted line.

If the cross-sectional shape of grounding via 302 is an elliptical shape, in the cross section that is parallel with the wiring layers, grounding via 302 is disposed close to the periphery of first via 102a and second via 102b. Therefore, the increase in impedance of the wiring board is more effectively suppressed, and the wiring region of the wiring board can be reduced.

Next, a method of manufacturing the wiring board according to the second exemplary embodiment will be described.

FIGS. 8A to 8D are diagrams for illustrating different steps in the method of manufacturing the wiring board according to this exemplary embodiment.

First, core substrate 301 having a wiring layer to form the power supply layer on one surface and a wiring layer to form the grounding layer on the other surface is prepared. Then, grounding via 302 is formed in core substrate 301 (see FIG. 8A).

Figure 8A:
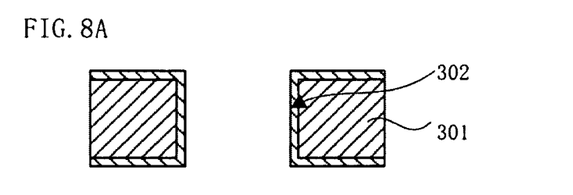
FIGS. 8A through 8D are diagrams for illustrating steps in a method of manufacturing the wiring board according to the second exemplary embodiment.

Specifically, a through-hole is formed in core substrate 301, and a conductor is deposited on the inner surface of the through-hole. The conductor can be deposited by plating, for example. In this way, grounding via 302 is formed. Then, the interior of grounding via 302 is filled with an insulator.

Figure 8B:
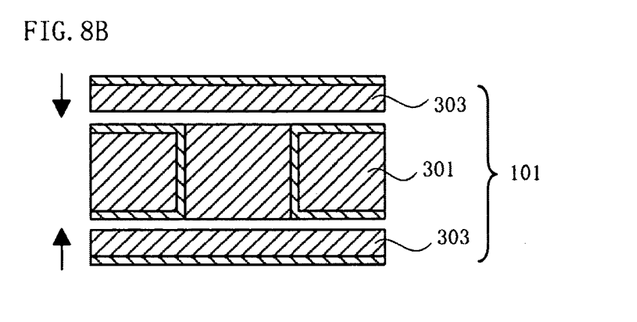

Then, insulating layer 303 is stacked on both the surfaces of core substrate 301 (see FIG. 8B). Specifically, insulating layers 303 are stacked on core substrate 301 and pressed against core substrate 301 to integrate core substrate 301 and insulating layers 303 with each other. In this way, wiring board 101 having a plurality of wiring layers is formed. Insulating layers 303 can be stacked by using any known technique.

Insulating layers 303 stacked on core substrate 301 are preferably made of the same material as the insulator filling the interior of grounding via 302. In that case, these insulators can be integrally formed.

Then, the via forming method described in the first exemplary embodiment is carried out. In this exemplary embodiment, first via 102a and second via 102b are formed to penetrate through a region surrounded by grounding via 302.

Figure 8C:
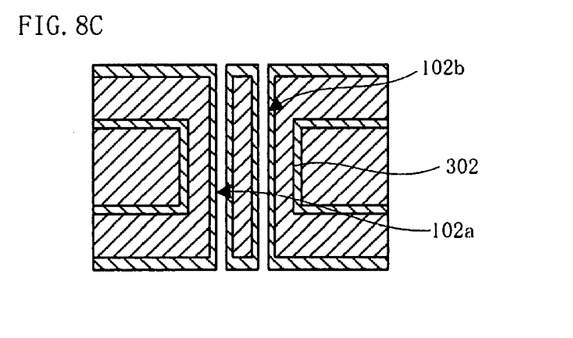

Specifically, in the first step of the via forming method, first via 102a and second via 102b are formed in wiring board 101 in such a manner that first land 103a and second land 103b partially overlap with each other (see FIG. 8C). First land 103a and second land 103b are formed on at least one surface of wiring board 101.

Figure 8D:
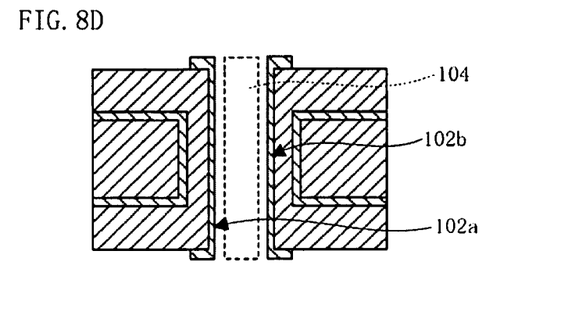

Then, in the second step of the via forming method, separator 104 is formed in wiring board 101 in such a manner that first land 103a and second land 103b are separated from each other (see FIG. 8D). In this way, the wiring board according to the second exemplary embodiment can be manufactured.

In this exemplary embodiment, wiring board 101 having four wiring layers has been described in detail. However, the wiring board can have four or more wiring layers. In that case, the grounding via does not need to be formed in the core substrate that forms a core of the wiring board, and the grounding via can be formed so as to connect wiring layers to each other.

Figure 9:
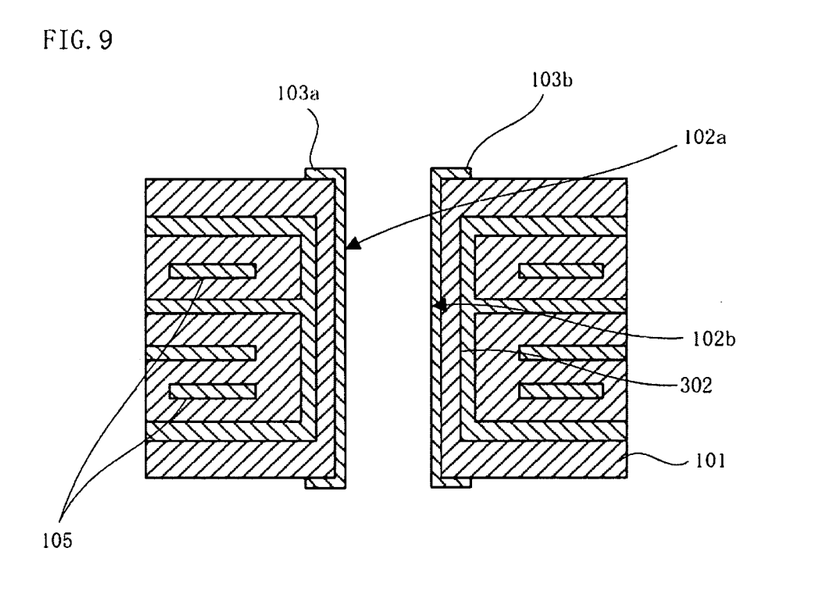
FIG. 9 is a schematic cross-sectional view of a wiring board according to a modification example of the second exemplary embodiment.

FIG. 9 is a schematic cross-sectional view of a wiring board according to a modification example of the second exemplary embodiment. In FIG. 9, grounding via 302 electrically connects arbitrarily selected three wiring layers other than layers in the core substrate to each other. First via 102a and second via 102b penetrate through an inner region of grounding via 302.

Such wiring board 101 can be manufactured by forming a plurality of wiring layers on a core substrate, forming grounding via 302 and then further stacking a wiring layer. The wiring layers can be stacked one by one or in units of two or more layers.

In the first and second exemplary embodiments, first via 102a and second via 102b penetrate through wiring board 101. However, first via 102a and second via 102b do not need to penetrate through wiring board 101. It is essential only that first via 102a and second via 102b are formed to pass through at least two wiring layers.

First via 102a and second via 102b can also electrically connect inner wiring layers that are not exposed on the surfaces of wiring board 101 to each other. Alternatively, first via 102a and second via 102b can electrically connect the outermost wiring layer exposed on one surface of wiring board 101 and the inner wiring layer to each other.

That is, first via 102a and second via 102b have only to electrically connect a first wiring layer and a second wiring layer of a plurality of wiring layers to each other. Grounding via 302 is preferably formed in layers deeper than the first and second wiring layers.

Vias 102a and 102b formed in inner wiring layers can be easily formed by further stacking a wiring layer on wiring board 101 described in the first and second exemplary embodiments. In that case, the hole of separator 104 is preferably formed to penetrate through at least the wiring layers that are connected by first via 102a and second via 102b.

Third Exemplary Embodiment

According to a third exemplary embodiment, first via 102a and second via 102b penetrate through a wiring board. However, first via 102a and second via 102b electrically connect an outermost layer (a wiring layer exposed on the surface) and an inner wiring layer to each other. That is, first via 102a and second via 102b have stub 401, which is an extra region that does not contribute to signal transmission (see FIG. 10A).

Figure 10A:
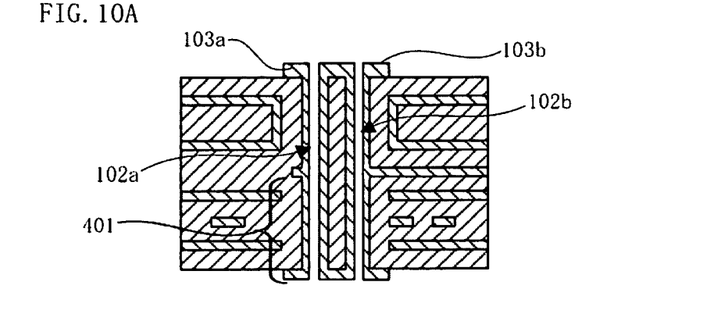
FIGS. 10A through 10D are diagrams for illustrating a stub removing step in a method for forming a via according to a third exemplary embodiment.

The presence of such stub 401 causes an increase in capacitance and a mismatch of impedance of wiring board 101. Therefore, stub 401 is preferably removed from wiring board 101.

In the following, a via forming method that includes a step of removing a stub will be described with reference to FIGS. 10A to 10D.

FIG. 10A is a schematic cross-sectional view of a wiring board at the time when the first step in the via forming method is completed. Up to the first step, the via forming method is the same as in the first and second exemplary embodiments. In the third exemplary embodiment, first via 102a and second via 102b have stub 401. First land 103a and second land 103b are formed to overlap with each other.

Figure 10B:
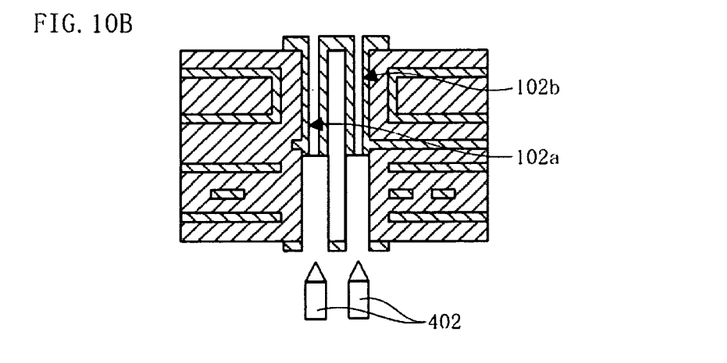
Figure 10C:
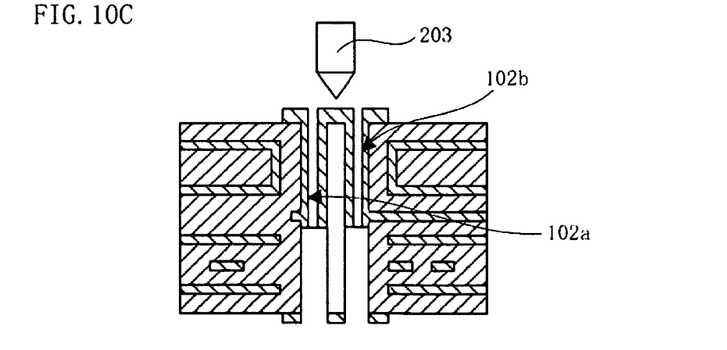
Figure 10D:
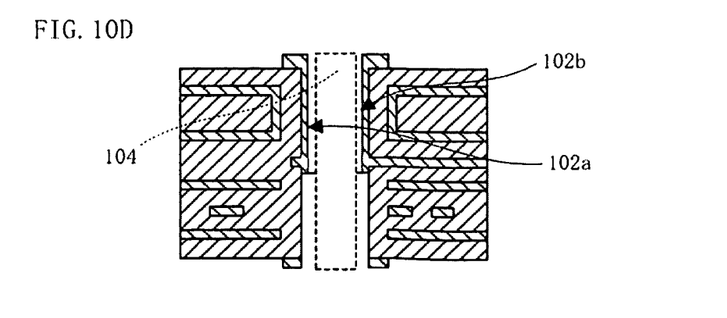

Then, in a stub removing step, stub 401 is removed (see FIG. 10B). Stub 401 can be easily removed by a back drill process using drill 402. By this step, the increase in capacitance caused by stub 401 is prevented.

Then, as in the first and second exemplary embodiments, the second step in the via forming method is carried out. By the second step, first via 102a and second via 102b can be insulated from each other.

In the third exemplary embodiment described above, the stub removing step is carried out between the first step and the second step in the via forming method. Alternatively, however, the stub removing step can be carried out after the second step.

In the exemplary embodiments described above, a drill is used for forming holes (including the holes of vias and the hole of separator 104) in the wiring board in method for forming the via. However, the method for forming the holes is not limited to the method using the drill, and the holes can be formed by any method that can form desired holes in the wiring board.

While preferred embodiments of the present invention have been described using specific terms, such description is for illustrative purposes only, and it is to be understood that changes and variations may be made without departing from the spirit or scope of the following claims.

What is claimed is:

1. A method forming, in a wiring board having a plurality of wiring layers, a first via and a second via that electrically connect a first wiring layer and a second wiring layer of the plurality of wiring layers to each other, comprising:
- disposing a first land and a second land on one surface of said wiring board in such a manner that the first land and the second land partially overlap with each other;
- forming said first via associated with said first land;
- forming said second via associated with said second land;
- forming a separator that consists of a single circular hole that separates said first land and said second land from each other; and
- forming one or more stubs that are part of one or more of the first via and the second via, the one or more stubs being components of the wiring board other than components of the wiring board between the first wiring layer and the second wiring layer, at least one of the one or more stubs extending from the second wiring layer to a surface of the wiring board,
- wherein each stub is an extra region that does not contribute to signal transmission,
- wherein the method further comprises removing said stubs.

2. The method according to claim 1, wherein said hole is formed to penetrate through said wiring board.

3. The method according to claim 1, wherein said first via and said second via are a pair of vias for differential lines.

4. The method according to claim 1, wherein said hole of said separator is formed in such a manner that said hole reaches a part of said first via and a part of said second via in a plane that is parallel with said wiring layers.

5. The method according to claim 1, wherein a conductor is deposited by plating on an inner wall of said first via and an inner wall of said second via before said hole of said separator is formed.

6. A method of manufacturing a wiring board that has a plurality of wiring layers and a first via and a second via that electrically connect a first wiring layer and a second wiring layer of said plurality of wiring layers to each other,
wherein said first via and said second via are formed by the method according to claim 1.

* * * * *